(12) United States Patent
Yamamura

(10) Patent No.: US 7,200,026 B2
(45) Date of Patent: Apr. 3, 2007

(54) FERROELECTRIC MEMORY DEVICE AND ELECTRONIC DEVICE

(75) Inventor: Mitsuhiro Yamamura, Suwa (JP)

(73) Assignee: Seiko Epson Corporation (JP)

( * ) Notice: Subject to any disclaimer, the term of this patent is extended or adjusted under 35 U.S.C. 154(b) by 61 days.

(21) Appl. No.: 10/980,979

(22) Filed: Nov. 4, 2004

(65) Prior Publication Data

US 2005/0122818 A1 Jun. 9, 2005

(30) Foreign Application Priority Data

Nov. 6, 2003 (JP) .............................. 2003-377067

(51) Int. Cl.
*G11C 11/22* (2006.01)
(52) U.S. Cl. ....................... 365/145; 365/149
(58) Field of Classification Search ................ 365/117, 365/148, 145, 149, 185.23
See application file for complete search history.

(56) References Cited

U.S. PATENT DOCUMENTS

| | | | |
|---|---|---|---|
| 5,038,323 A * | 8/1991 | Schwee ........................ | 365/145 |
| 5,721,699 A * | 2/1998 | DeVilbiss .................... | 365/145 |
| 5,880,989 A * | 3/1999 | Wilson et al. ............... | 365/145 |
| 5,926,412 A * | 7/1999 | Evans et al. ................. | 365/145 |
| 6,426,906 B1 | 7/2002 | Igarashi | |
| 2002/0015323 A1* | 2/2002 | Maruyama ................... | 365/145 |
| 2006/0013033 A1* | 1/2006 | Yamamura ................... | 365/145 |
| 2006/0023485 A1* | 2/2006 | Yamamura ................... | 365/145 |

FOREIGN PATENT DOCUMENTS

| | | |
|---|---|---|
| JP | 08-180672 | 7/1996 |
| JP | 2002-083496 | 3/2002 |
| JP | 2002-100183 | 4/2002 |
| JP | 2003-242772 | 8/2003 |

OTHER PUBLICATIONS

English translation of "Communication from Japanese Patent Office re: counterpart application" submitted on IDS filed by Applicant on May 10, 2005.*
Communication from Japanese Patent Office re: counterpart application.

* cited by examiner

*Primary Examiner*—Anh Phung
*Assistant Examiner*—Alexander Sofocleous
(74) *Attorney, Agent, or Firm*—Harness, Dickey & Pierce, P.L.C.

(57) ABSTRACT

A ferroelectric memory is provided including a ferroelectric capacitor having an end electrically coupled to a bit line; a power source generating a predetermined voltage; a resistance formed between the bit line and the power source; and a switch installed in series with the resistor, and switching whether a predetermined voltage is applied to the bit line via the resistor or not. The voltage source preferably generates a driving voltage driving the ferroelectric memory, a voltage between the resistive voltage of the ferroelectric capacitor and the driving voltage driving the ferroelectric memory, or a voltage that is less than the coercive voltage of the ferroelectric capacitor.

8 Claims, 6 Drawing Sheets

FERROELECTRIC MEMORY DEVICE AND ELECTRONIC DEVICE

RELATED APPLICATIONS

This application claims priority to Japanese Patent Application No. 2003-377067 filed Nov. 6, 2003 which is hereby expressly incorporated by reference herein in its entirety.

BACKGROUND

1. Technical Field

The present invention relates to a electric memory device and electronic device. The present invention particularly relates to a ferroelectric memory device having less deterioration of a ferroelectric material.

2. Related Art

A conventional FeRAM is disclosed in the Japanese Unexamined Patent Publication No. 2002-100183. The ferroelectric memory disclosed in Publication No. 2002-100183 is provided with a 0 level setting circuit setting the lower voltage signal among digitized signals before a sensing amplifier.

The conventional FeRAM disclosed in Publication No. 2002-100183 has, however, a problem in that the ferroelectric material constituting the memory is easily fatigued because of the high voltage applied to the memory cell. Further, the circuit structure is so complex that it takes a long time to read out data and an operating speed is slow.

Therefore, the present invention aims to provide a ferroelectric memory device and an electronic device that can overcome the above problem.

SUMMARY

In order to attain the above object, a ferroelectric memory device of the first aspect of the present invention comprises: a ferroelectric capacitor having an end electrically coupled to a bit line; a power source generating a predetermined voltage; a resistance formed between the bit line and the power source; and a switch installed between the power source and the bit line and switching whether the predetermined voltage is provided to the bit line or not via the resistance during a predetermined period. Here, the switch is an n-channel or a p-channel MOS transistor.

According to this structure, a charging feature of the bit line is greatly changed in response to data read in the ferroelectric capacitor. Therefore, a large potential difference for reading out among data stored in the ferroelectric capacitor can be obtained such that a large margin can be taken toward the material characteristics of the ferroelectric material. Therefore, the ferroelectric memory device can be operated stably.

Further, according to this structure, even if a size of a memory cell becomes large, sufficient reading out voltage can be assured so that a ferroelectric memory device easily becomes one with a large volume and high integration.

Further, the voltage power source may generate a voltage, as the predetermined voltage, which is almost (substantially) equivalent to a voltage for driving the ferroelectric memory. Further, the voltage power source may generate a voltage, as the predetermined voltage, which is almost equivalent to a voltage for driving the ferroelectric memory. According to this structure, the driving voltage source for generating the driving voltage is used as the above voltage source so that the ferroelectric memory device can be highly integrated.

Further, the voltage power source may generate a voltage, as the predetermined voltage, which is between a voltage driving the ferroelectric memory and a coercive voltage of the ferroelectric capacitor. According to this structure, the voltage applied to the ferroelectric member in the form of a ferroelectric capacitor can be small so that the ferroelectric member characteristics such as deterioration can be restrained. Thus, a highly reliable ferroelectric memory device can be provided.

Further, the voltage power source may generate a voltage as the predetermined voltage, which is less than a coercive voltage of the ferroelectric capacitor. According to this structure, the deterioration of ferroelectric member characteristics can be restrained and a ferroelectric memory in which re-writing data is not necessary can be provided.

The switch may be an n-channel transistor having one of a source and a drain electrically coupled to the power source or the bit line and the other of the source and the drain electrically coupled to the resistance. Thus, a highly reliable ferroelectric memory device can be provided.

The ferroelectric memory device may further comprise a control means that controls the switch to cease the supply of the predetermined voltage before a voltage in the bit line reaches or nearly reaches the predetermined voltage, after supplying the predetermined voltage to the bit line and the resistive element. A ferroelectric memory device may further comprise: a plate line electrically coupled to one end of the ferroelectric capacitor and a plate line controller controlling the potential of the plate line to be at a ground level while supplying the predetermined voltage to the bit line. According to this structure, a large reading out voltage difference can be obtained during a reading out operation, so that a ferroelectric memory device having stable operation can be provided.

According to the second aspect of the invention, an electronic device having the above ferroelectric memory device is provided. Here, an electronic device is defined as a general device performing a given function and having a memory device related to the present invention, but its structure is not specifically limited. For example, these devices include various kinds of devices such as a general computer having the above memory, a cellar phone, a PHS, a PDA, an electronic note and an IC card.

DETAILED DESCRIPTION

Figure 1:
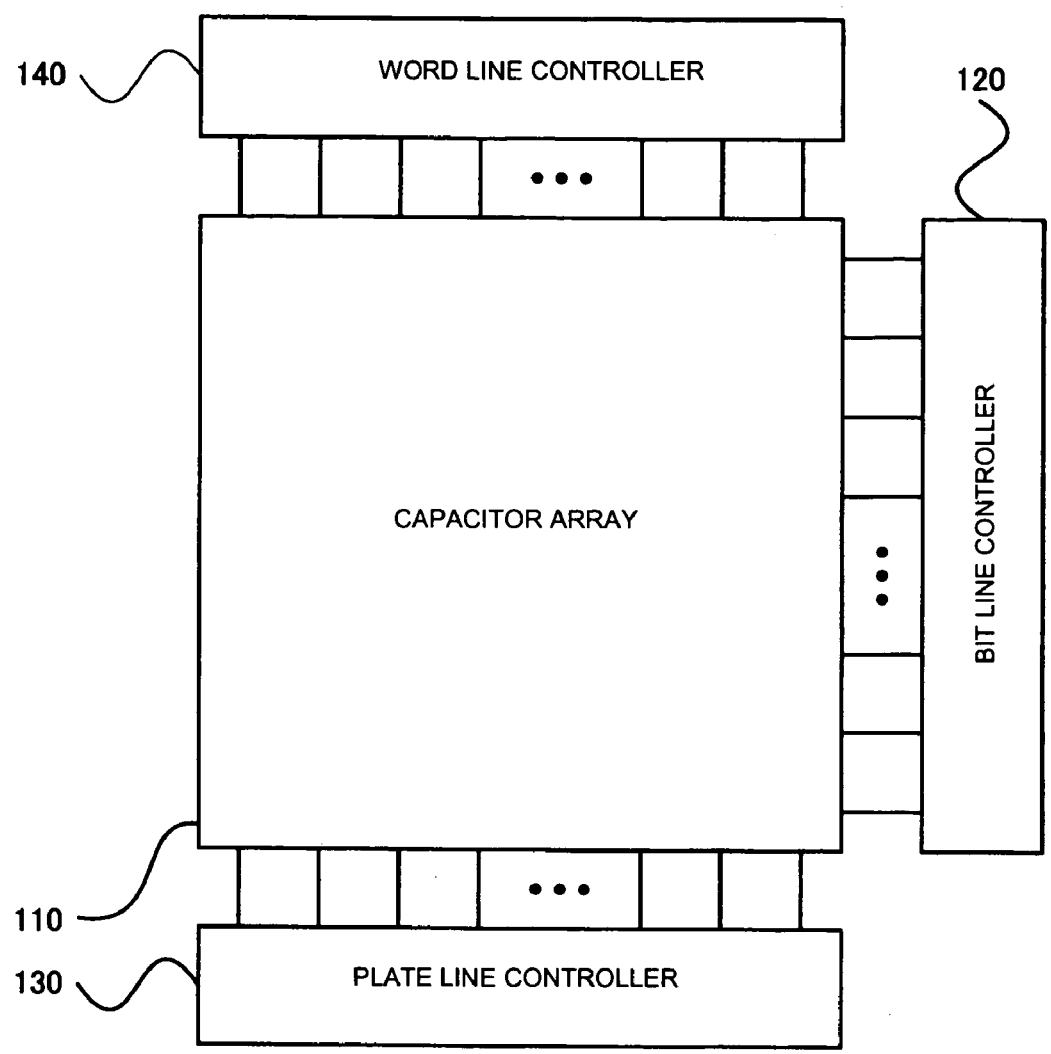
FIG. 1 shows a block diagram of the ferroelectric memory device 100 in the embodiment of the present invention.

The preferred embodiments of the invention will be explained as follows referring to the drawings. The following embodiments do not limit the scope of the invention. Further, all combinations of features explained in these embodiments are not essential to the invention.

FIG. 1 shows a block diagram of a ferroelectric memory device 100 of the embodiment of the invention. The ferroelectric, memory device 100 comprises a capacitor array 110 having a plurality of ferroelectric capacitors arranged in array, a bit line controller 120, a plate line controller 130, and a word line controller 140.

The bit line controller 120 controls the potential of the bit line BL and judges data stored in the ferroelectric capacitor Cp based on the potential of the bit line BL.

The plate line controller 130 controls the potential of the plate line PL. Further, the word line controller 140 controls the potential of the word line WL.

Figure 2:
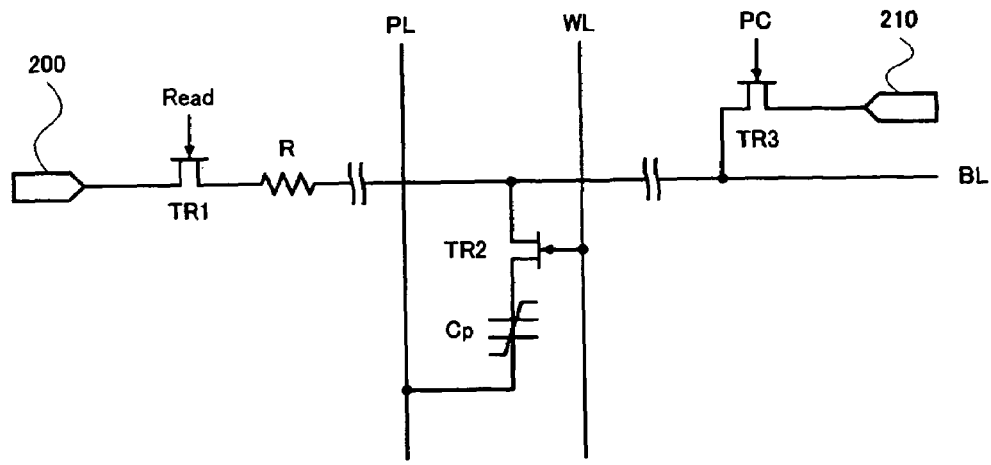
FIG. 2 shows a part of a circuit of the capacitor array 110.

FIG. 2 shows a part of the circuit in the capacitor array 110. The capacitor array 110 comprises the bit line BL, the plate line PL, the ferroelectric capacitor Cp, a constant voltage source 200 as an example of voltage sources, a pre-charge voltage source 210, a resistor R, transistors TR1, TR2 and TR3 as examples of switches. Here, the capacitor array 110 includes a plurality of the ferroelectric capacitors Cp arranged in array. The structure and operation of the ferroelectric memory device 100 will be explained based on one of the plurality of the ferroelectric capacitors Cp.

One end of the ferroelectric capacitor Cp is electrically coupled to the bit line BL via the transistor TR2 and another end of it is electrically coupled to the plate line PL. Namely, one of a drain and a source of the transistor TR2 is electrically coupled to one end of the ferroelectric capacitor Cp and the other is coupled to the bit line. Further, the gate of the transistor TR2 is coupled to the word line WL. The transistor TR2 switches whether the bit line BL is electrically coupled the ferroelectric capacitor Cp or not, in response to the change of the potential of the word line WL.

The constant voltage source 200 generates a predetermined voltage supplied to the bit line BL. The constant voltage source 200 generates a voltage which is substantially equivalent to a drive voltage VCC for driving the ferroelectric memory device 100. In this case, the constant voltage source 200 may be a driving voltage source, which is installed in the ferroelectric memory device 100 to generate the driving voltage VCC.

As another example, the constant voltage source 200 may generate a voltage between the driving voltage VCC and a coercive voltage Vc described hereafter. Further, it may generate a voltage which is less than the coercive voltage Vc. The operation of the ferroelectric memory device 100 will be explained hereafter referring to FIG. 7 and FIG. 8 when the constant voltage source 200 generates these voltages and supplies them to the bit line.

The resistor R is installed between the bit line BL and the constant voltage source 200. Further, the transistor TR1 installed between the constant voltage 200 and the bit line BL supplies a voltage generated by the constant voltage 200 to the bit line BL via the resistor R. One of a drain and a source of the transistor TR2 is electrically coupled to one end of the ferroelectric capacitor Cp and the other is coupled to the bit line. Further, a signal "Read" is supplied to the gate of the transistor TR1 that switches whether this voltage is supplied to the bit line BL via the resistor R or not, based on the change of the potential of the signal "Read".

Here, the constant voltage source 200 is installed at the end of the bit line via the transistor TR1 and the resistor R in this embodiment. But, in another aspect, this source may be installed so as to supply a predetermined voltage to the bit line BL among the points where a plurality of transistors TR2 are electrically coupled in the bit line BL. Further, this source may be installed so as to supply a predetermined voltage to the bit line BL between the points where the ferroelectric capacitors Cp are electrically coupled to the bit line BL and points where a plurality of transistors TR3 are electrically coupled. In this case, it is desirable that the resistor R is installed between the constant voltage 200 and the bit line BL and the transistor TR1 is installed in series with the resistor R.

The pre-charge voltage source 210 generates a pre-charge voltage to pre-charge the bit line BL. The pre-charge voltage source 210 is coupled to the bit line via the transistor TR3. Further, a signal "PC" is supplied to the gate of the transistor TR3 that switches whether the bit line BL is charged to the pre-charged voltage VPR or not, based on the change of the potential of the signal "PC".

The pre-charge voltage source 210 may be a voltage source that supplies 0V to the bit line BL as a pre-charge voltage VPR. Namely, the capacitor array 110 may be a structure in which the bit line BL is coupled to the ground via the transistor TR3 instead of a structure including the pre-charge voltage source 210.

Figure 3:
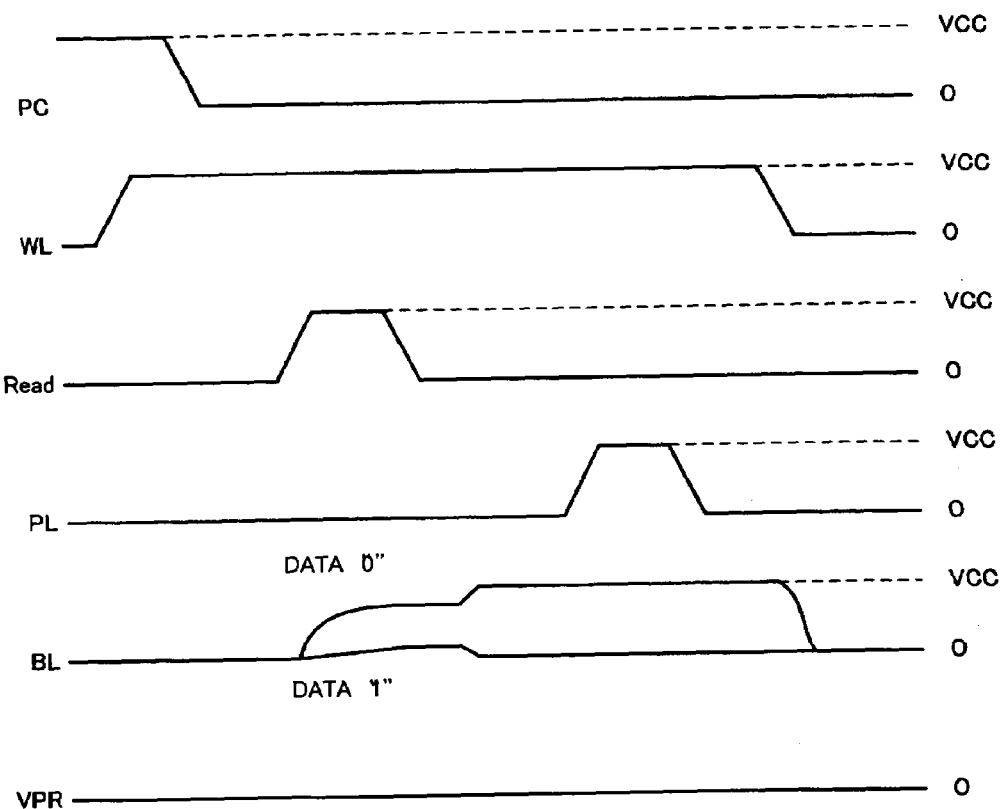
FIG. 3 shows a timing chart of a first example of the reading out operation for reading out data stored in the ferroelectric capacitor and writing data into it in the ferroelectric memory device 100 of the present invention.

FIG. 3 shows a timing chart of a first example reading out operation, which reads data out from the ferroelectric capacitor Cp and a writing data operation, which writes data according to the above embodiment of the ferroelectric memory device 100. In the example, the constant voltage source 200 generates a predetermined voltage supplied to the bit line BL.

Firstly, the transistor TR3 is turned on by making the potential of the signal PC equal to VCC so as to pre-charge the bit line BL. In this example, the pre-charge voltage source 210 generates 0V as the pre-charge voltage VPR so as to pre-charge the bit line to 0V.

Next, the transistor TR2 is turned on by changing the potential of the word line from 0V to VCC. Thus, the potential at one end of the ferroelectric capacitor Cp becomes 0V and a potential difference between both ends of the ferroelectric capacitor Cp also becomes 0V because 0V exists at the potential of the plate line PL.

Next, the transistor TR3 is turned off by making the signal PC equal to 0V so as to make the bit line BL float. Then, the transistor TR1 is turned on by making the signal "Read" equal to VCC. Thus, VCC is supplied to the bit line via the resistor R from the constant voltage source 200 so as to charge the potential at the bit line BL according to a predetermined charge wave form.

At this time, the time constant is changed based on the ferroelectric capacitor Cp so that the charging wave forms at the bit line BL are different based on the data. In particular, when the data stored in the ferroelectric capacitor Cp is "0", the waveform has a steep rise in the potential at the bit line. When the data is "1", the charging waveform has a moderate rise in the potential at the bit line BL as compared to the data "0". The charging waveform will be described in detail referring to FIGS. 4 and 5.

Next, after the predetermined time elapses when making the potential of the signal "Read" equal to VCC, the transistor TR1 is turned on by making the potential 0V. Thus, the bit line BL becomes floated so that the potential of the bit line BL at the time when turning the transistor TR1 off can be maintained. In particular, a predetermined potential difference is caused between the case when the data stored in the ferroelectric capacitor Cp is "0" and the case when the data is "1". The sensing amplifier (not shown in the figure) installed in the bit line controller 120 amplifies the potential the bit line BL and judges the data stored in the ferroelectric capacitor Cp based on the amplified potential of the bit line BL.

Next, after the potential at the plate line PL is changed from 0V to VCC, it is changed to 0V again so as to write data to the ferroelectric capacitor Cp again. Then, the operations of reading out and writing in are completed by making the bit line BL and the word line WL equal to 0V.

Figure 4:
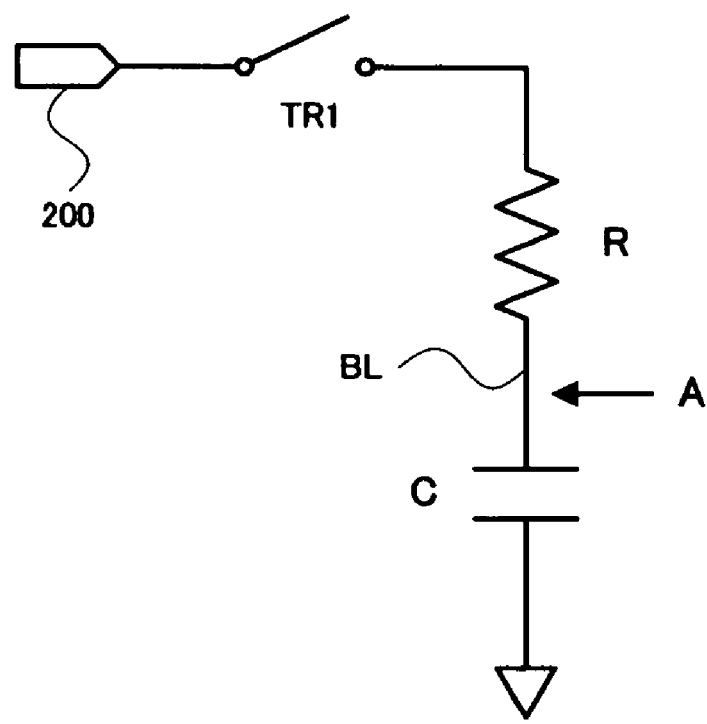
FIG. 4 shows an equivalent circuit of the capacitor array 110.

FIG. 4 shows the equivalent circuit of the capacitor array 110. Since the ferroelectric capacitor Cp including the capacitance C, the capacitor array 110 in this embodiment has an RC series-connected circuit with the resistor R, the ferroelectric capacitor Co and the bit line BL. Here, when the transistor TR3 is turned on and the voltage generated by the constant voltage source 200 is charged to the bit line BL, the potential Vt at the point A of the bit line BL after t seconds is expressed as the following.

$$Vt = VCC \times (1 - e^{-t/CR}) \quad (1)$$

Here, the time constant CR shows the time when the potential of the bit line BL rises to $(1-e^{-1})$ of the applied potential VCC, namely 63.2%. Namely, the larger the time constant CR is, the more charging time for charging the bit line BL is delayed. The time constant CR is changed in response to the capacitance C of the ferroelectric capacitor Cp so that the charging time is changed in response to data stored in the ferroelectric capacitor Cp. The change of the capacitance C of the ferroelectric capacitor Cp in response to the data stored in the ferroelectric capacitor Cp is described as follows.

Figure 5A:
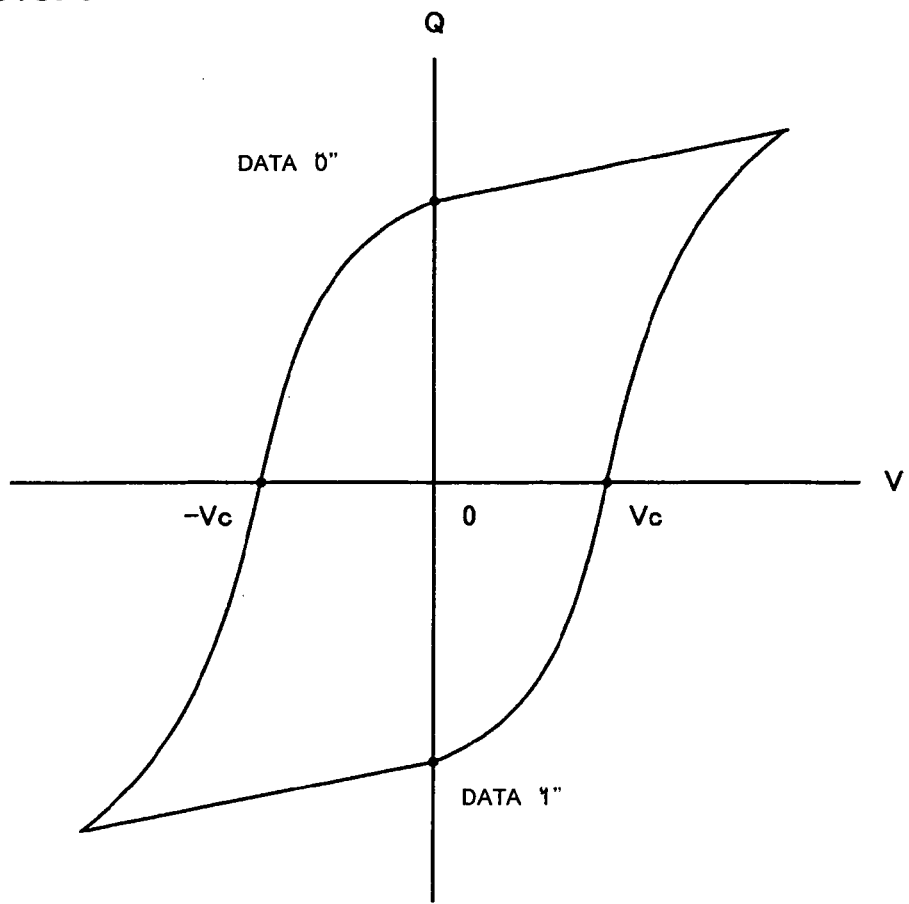
FIGS. 5(a) and 5(b) show a Q-V hysteresis curve and the C-V characteristics of the ferroelectric capacitor Cp.

FIG. 5 shows the Q-V hysterics curve and the C-V characteristics of the ferroelectric capacitor Cp. In the Q-V hysterics curve of the ferroelectric capacitor Cp shown in FIG. 5(a), the gradient ($\Delta Q/\Delta V$) indicates the capacitance C of the ferroelectric capacitor Cp. The capacitance C shows a large value when it has a steep gradient, and a small value when it has moderate gradient.

Figure 5B:
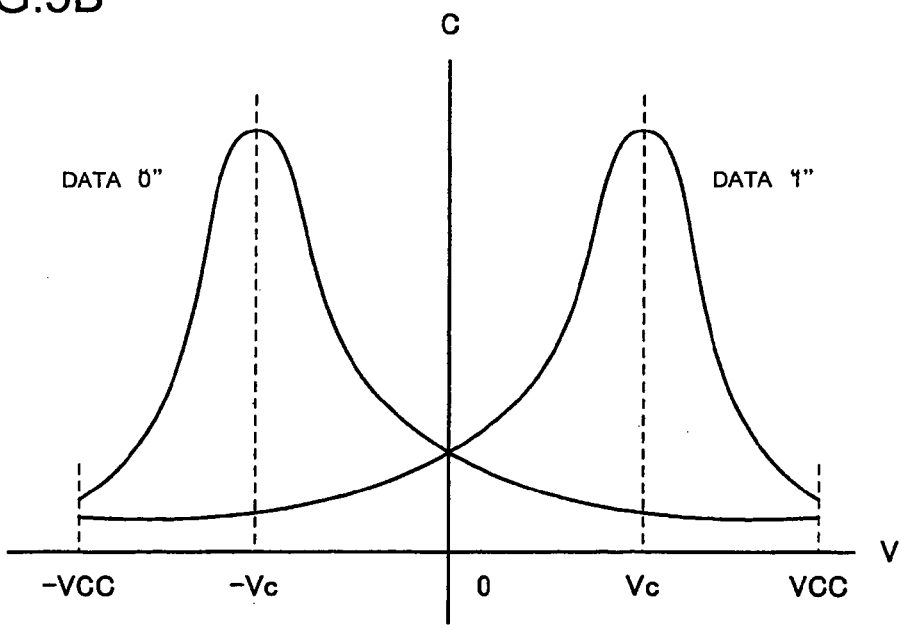

FIG. 5(b) shows the C-V characteristics indicating the capacitance C of the ferroelectric capacitor Cp corresponding to voltage V. As shown in the figure, the capacitance C varies depending on the data stored in the ferroelectric capacitor Cp and the voltage V. Namely, when the positive voltage is gradually applied to the ferroelectric capacitor Cp from 0V, the capacitance C is gradually decreased if the data stored in the ferroelectric capacitor Cp. On the other hand, when the data is "1", the capacitance C is rapidly increased and becomes a local maximum at the coercive voltage Vc and −Vc, which is a voltage if an amount of polarizations in the ferroelectric capacitor Cp is almost zero. Then, the capacitance is rapidly decreased.

Next, a variation of the potential of the bit line BL depending on the capacitance C is explained.

Figure 6:
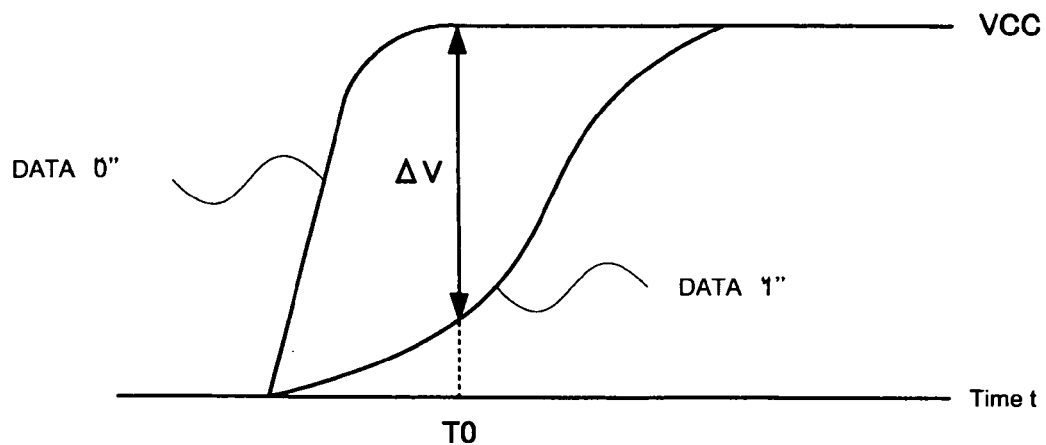
FIG. 6 shows the potential of the bit line corresponding to time t for supplying VCC to the bit line BL.

FIG. 6 shows the potential of the bit line corresponding to the time t for supplying VCC to the bit line BL. As described above, the capacitance C varies depending on the data stored in the ferroelectric capacitor Cp. Hence, if VCC is supplied to the bit line BL via the resistor R, the potential of the bit line BL is rapidly increased when the data is "0", and moderately increased when the data is "1". Namely, in the potential of the bit line BL at the predetermined time T0, the potential difference becomes $\Delta V$ between cases when the data is "0" and "1".

Referring to FIG. 3, when the potential of the signal "Read" is changed from 0V to VCC, charging in the bit line is started and when the potential of the signal "Read" is changed from VCC to 0, charging in the bit line is stopped and the bit line BL goes to a floating state maintaining the potential at the above stoppage. Therefore, at the time when a predetermined potential difference occurs between cases when the data is "0" and "1", charging the bit line BL is stopped so that the data stored in the ferroelectric capacitor Cp can be judged.

Figure 7:
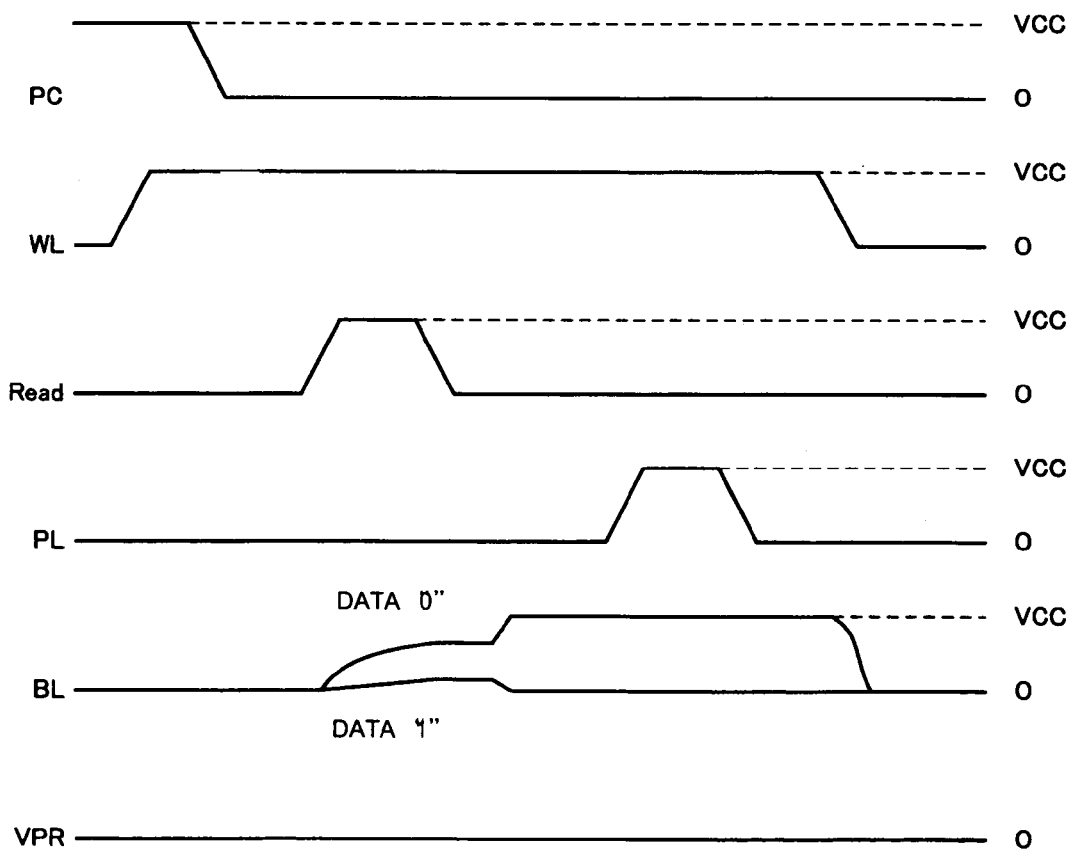
FIG. 7 shows a timing chart of a second example of the reading out operation for reading out data stored in the ferroelectric capacitor Cp and writing data into it in the ferroelectric capacitor 100 of the present embodiment.

FIG. 7 is a timing chart showing a second example of a reading out operation for reading data stored in the ferroelectric capacitor Cp and a writing operation for writing data regarding the ferroelectric memory device 100 of the present embodiment. In the example, the operations of reading out and writing in are the same as in the first example. However, the constant voltage 200 generates a voltage between the coercive voltage Vc and the driving voltage VCC of the ferroelectric capacitor Cp. Hence, in this example, the voltage charged to the bit line BL becomes lower than the first example so that the voltage applied to the ferroelectric capacitor Cp becomes further lowered. Therefore, deterioration of the ferroelectric member constituting the ferroelectric capacitor Cp can be further restrained.

Figure 8:
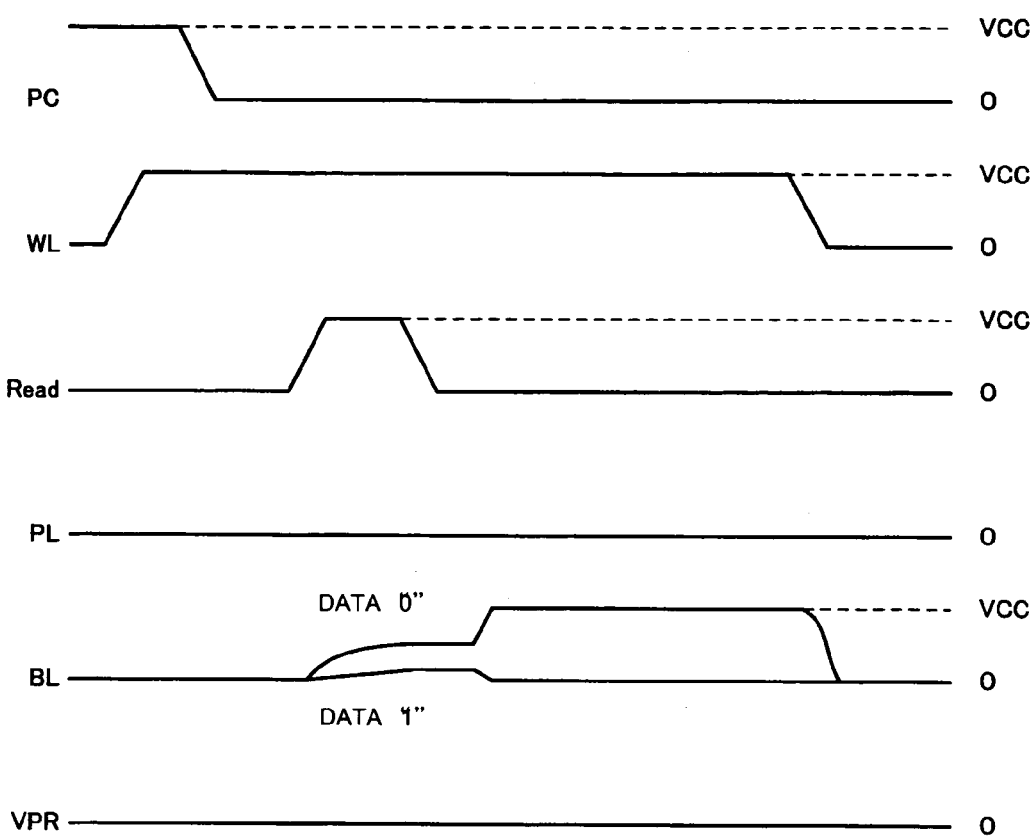
FIG. 8 shows a timing chart of a third example of the reading out operation for reading out data stored in the ferroelectric capacitor Cp and writing data into it in the ferroelectric capacitor 100 of the present embodiment.

FIG. 8 is a timing chart showing a third example of a reading out operation for reading data stored in the ferroelectric capacitor Cp and a writing operation for writing data regarding the ferroelectric memory device 100 of the present embodiment.

The reading out operation in this example is the same as in the first and second examples. On the other hand, the constant voltage 200 generates a voltage lower than the coercive voltage Vc of the ferroelectric capacitor in this example. Namely, a voltage higher than the coercive voltage Vc is not supplied to the ferroelectric capacitor Cp. Therefore, the data stored in the ferroelectric capacitor Cp is not destroyed due to the reading out operation so that a re-writing operation in which the potential of the plate line PL is changed from 0V to VCC is not needed.

According to this example, a re-writing operation is not needed so that the consumption of power can be reduced. Further, a re-writing operation is not needed and fatigue of the ferroelectric member constituting the ferroelectric capacitor Cp can be restrained.

Examples and applications in the embodiment of the present invention can be combined appropriately for intended purposes or modified or improved. It is clear that the present invention is not limited to the descriptions in the above embodiment and includes combinations of them and further modifications in view of the claims.

What is claimed is:

1. A ferroelectric memory device comprising:
   a constant voltage source generating a predetermined voltage selectively supplied to the bit line;
   a ferroelectric capacitor having a first end electrically coupled to a bit line and a second end electrically coupled to a plate line, the ferroelectric capacitor having a capacitance that varies based on data stored in the ferroelectric capacitor and the predetermined voltage;
   a resistor formed between the bit line and the constant voltage source having a first end electrically coupled in series with a first transistor and a second end electrically coupled to the bit line, the first transistor formed between the bit line and the constant voltage source and having a gate electrically coupled to a read signal that controls whether the predetermined voltage is provided to the bit line via the resistor during a predetermined period;

a second transistor between the ferroelectric capacitor and the bit line having a first end electrically coupled to the bit line, a second end electrically coupled to the ferroelectric capacitor, and a gate electrically coupled to a word line, ; and a third transistor having a first end electrically coupled to the bit line, a second end electrically coupled to a pre-charge voltage source, and a gate electrically coupled to a potential charge signal, the pre-charge voltage source selectively charges the bit line to a pre-charge voltage based on the potential charge signal.

2. The ferroelectric memory device according to claim 1, wherein the predetermined voltage generated by the constant voltage source is substantially equivalent to a voltage for driving the ferroelectric memory device.

3. The ferroelectric memory device according to claim 1, wherein the predetermined voltage generated by the constant voltage source is between a voltage driving the ferroelectric memory and a coercive voltage of the ferroelectric capacitor.

4. The ferroelectric memory device according to claim 1, wherein the predetermined voltage generated by the constant voltage source is less than a coercive voltage of the ferroelectric capacitor.

5. The ferroelectric memory device according to claim 1, wherein the first transistor comprises an n-channel having one of a source and a drain electrically coupled to one of the power source and the bit line, and the other of the source and the drain electrically coupled to the resistor.

6. The ferroelectric memory device according to claim 1, further comprising control means that controls the first transistor to cease supply of the predetermined voltage before a voltage in the bit line reaches the predetermined voltage, after supplying the predetermined voltage to the bit line and the resistor.

7. A ferroelectric memory device according to claim 6, further comprising:

a plate line electrically coupled to one end of the ferroelectric capacitor; and a plate line controller controlling a potential of the plate line to be at a ground level while supplying the predetermined voltage to the bit line.

8. An electronic device comprising:

a housing;

a ferroelectric memory device disposed in the housing, the ferroelectric memory device having a constant voltage source generating a predetermined voltage, the ferroelectric memory device having a ferroelectric capacitor having a first end electrically coupled to a bit line and a second end electrically coupled to a plate line, the ferroelectric memory device having a resistor formed between the bit line and the power source, the resistor having a first end electrically coupled in series with a first transistor and a second end electrically coupled to the bit line, the first transistor formed between the bit line and the constant voltage source and having a gate electrically coupled to a read signal that controls whether the predetermined voltage is provided to the bit line via the resistor during a predetermined time, the ferroelectric memory device having a second transistor between the ferroelectric capacitor and the bit line, the second transistor having a first end electrically coupled to the bit line, a second end electrically coupled to the ferroelectric capacitor, and a gate electrically coupled to a word line, and the ferroelectric memory device having a third transistor having a first end electrically coupled to the bit line, a second end electrically coupled to a pre-charge voltage source, and a gate electrically coupled to potential charge signal, the pre-charge voltage source selectively charges the bit line to a pre-charge voltage based on the potential charge signal; and wherein the ferroelectric capacitor has a capacitance that varies based on data stored in the ferroelectric capacitor and the predetermined voltage.

* * * * *